(12) United States Patent
Troost et al.

(10) Patent No.: US 7,538,855 B2
(45) Date of Patent: May 26, 2009

(54) LITHOGRAPHIC APPARATUS AND DEVICE MANUFACTURING METHOD

(75) Inventors: Kars Zeger Troost, Waalre (NL); Johan Christiaan Gerard Hoefnagels, Hooge Mierde (NL); Pieter Willem Herman de Jager, Rotterdam (NL)

(73) Assignee: ASML Netherlands B.V., Veldhoven (NL)

( * ) Notice: Subject to any disclaimer, the term of this patent is extended or adjusted under 35 U.S.C. 154(b) by 701 days.

(21) Appl. No.: 10/914,633

(22) Filed: Aug. 10, 2004

(65) Prior Publication Data

US 2006/0035160 A1 Feb. 16, 2006

(51) Int. Cl.
*G03B 27/54* (2006.01)
*G03B 27/42* (2006.01)

(52) U.S. Cl. .......................................... 355/67; 355/53
(58) Field of Classification Search .................. 355/67, 355/53, 51; 430/22; 359/290, 619
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,976,738 A | * 11/1999 | Nakashima | ................. 430/22 |
| 5,982,553 A | 11/1999 | Bloom et al. | |
| 6,133,986 A | 10/2000 | Johnson | |

(Continued)

FOREIGN PATENT DOCUMENTS

EP 1 482 375 A2 12/2004

(Continued)

OTHER PUBLICATIONS

English Abstract for Japanese Publication No. JP 4-287908 published Oct. 13, 1992, 1 pg.

(Continued)

*Primary Examiner*—Peter B Kim
(74) *Attorney, Agent, or Firm*—Sterne, Kessler, Goldstein & Fox P.L.L.C.

(57) ABSTRACT

A system and method use a lithographic apparatus to direct a plurality of patterned beams onto a substrate supported on a substrate table. The patterned beams are projected onto target portions of the substrate and relative displacement between the substrate and the patterned beams causes the beams to be scanned across the substrate. A first projection device projects a first relatively large area patterned beam which extends across a substantial proportion of the substrate. At least one second relatively small area patterned beam is selectively positioned relative to the first projection device at least in a direction transverse to the predetermined direction. The second beam may be used to expose an elongate portion of the substrate which extends in the direction of relative displacement. At least one third patterned beam of relatively small area may be provided which is selectively displaceable relative to the substrate table during relative displacement between the substrate and the first beam. The third patterned beam may be used to expose an elongate portion of the substrate which extends transversely to the direction of relative displacement.

14 Claims, 6 Drawing Sheets

U.S. PATENT DOCUMENTS

| | | |
|---|---|---|
| 6,177,980 B1 | 1/2001 | Johnson |
| 6,687,041 B1 | 2/2004 | Sandstrom |
| 6,747,783 B1 | 6/2004 | Sandstrom |
| 6,795,169 B2 | 9/2004 | Tanaka et al. |
| 6,806,897 B2 | 10/2004 | Kataoka et al. |
| 6,811,953 B2 | 11/2004 | Hatada et al. |
| 2004/0004700 A1* | 1/2004 | Park et al. .................... 355/53 |
| 2004/0041104 A1 | 3/2004 | Liebregts et al. |
| 2004/0095564 A1* | 5/2004 | Ozaki et al. ................... 355/51 |
| 2004/0130561 A1 | 7/2004 | Jain |
| 2006/0012766 A1* | 1/2006 | Klosner et al. ................ 355/67 |

FOREIGN PATENT DOCUMENTS

| | | |
|---|---|---|
| JP | 4-287908 A | 10/1992 |
| JP | 2001-168003 A | 6/2001 |
| WO | WO 98/33096 | 7/1998 |
| WO | WO 98/38597 | 9/1998 |

OTHER PUBLICATIONS

English Abstract for Japanese Publication No. JP 2001-168003 published Jun. 22, 2001, 2 pgs.

* cited by examiner

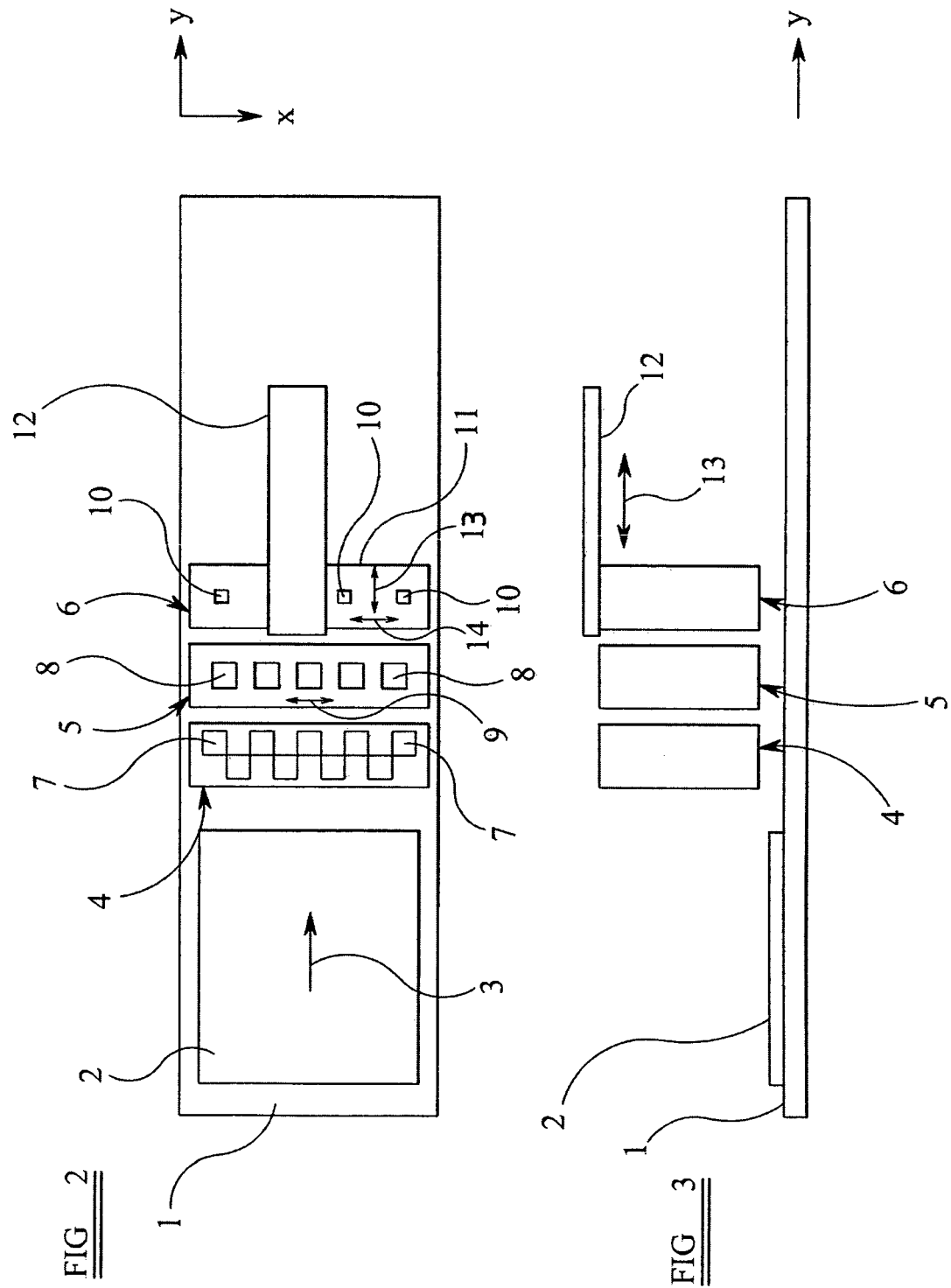

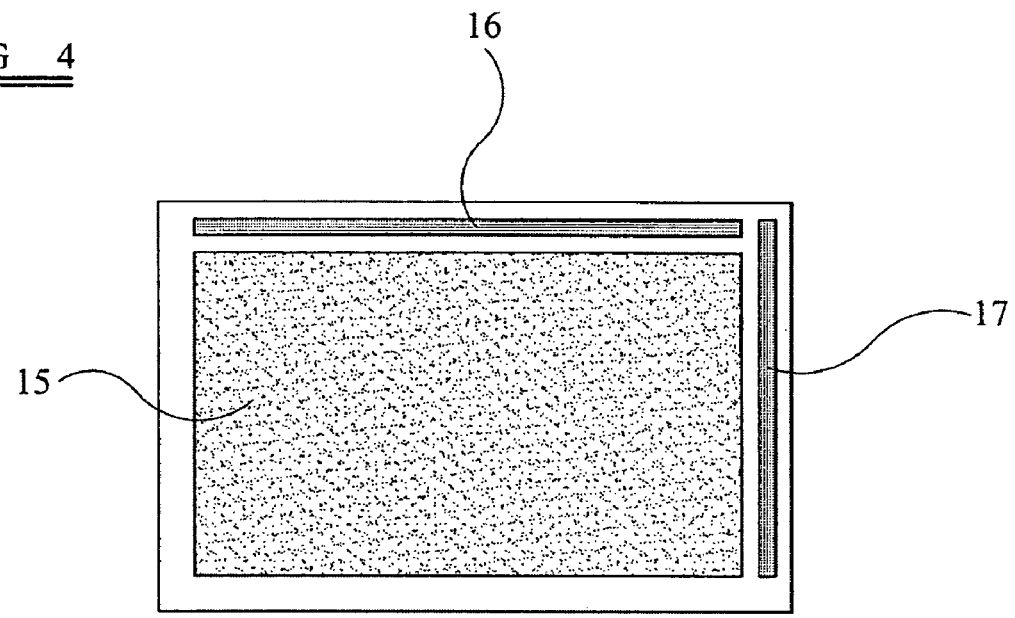
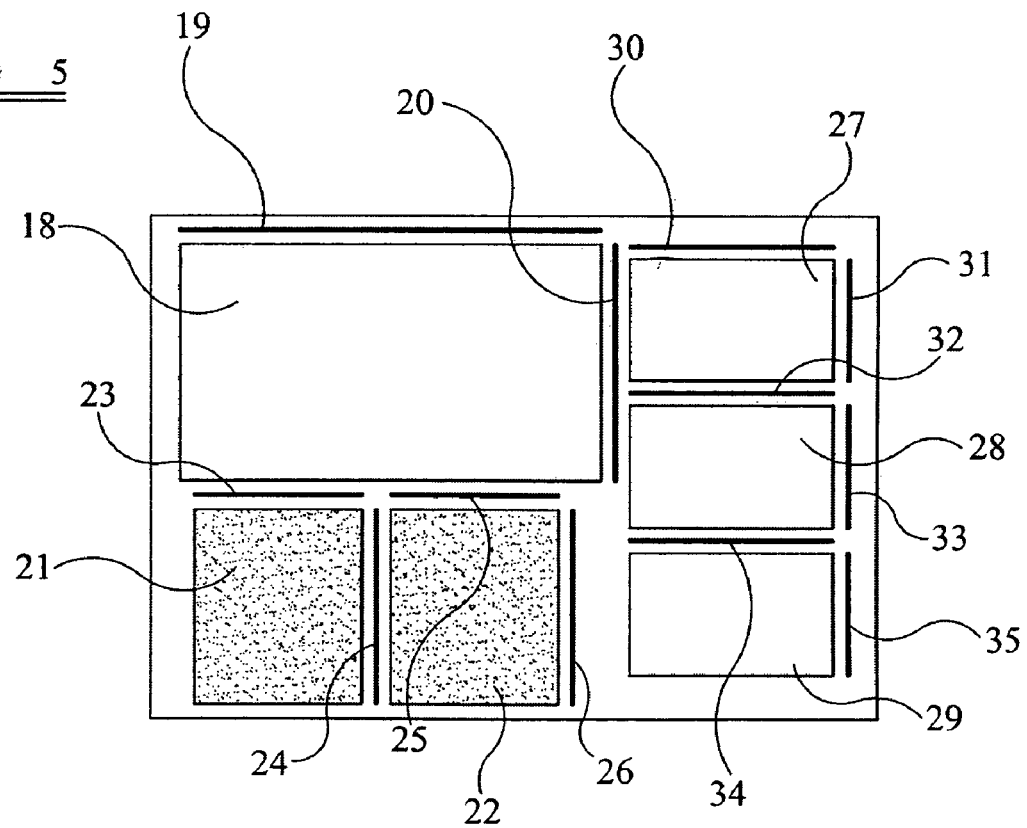

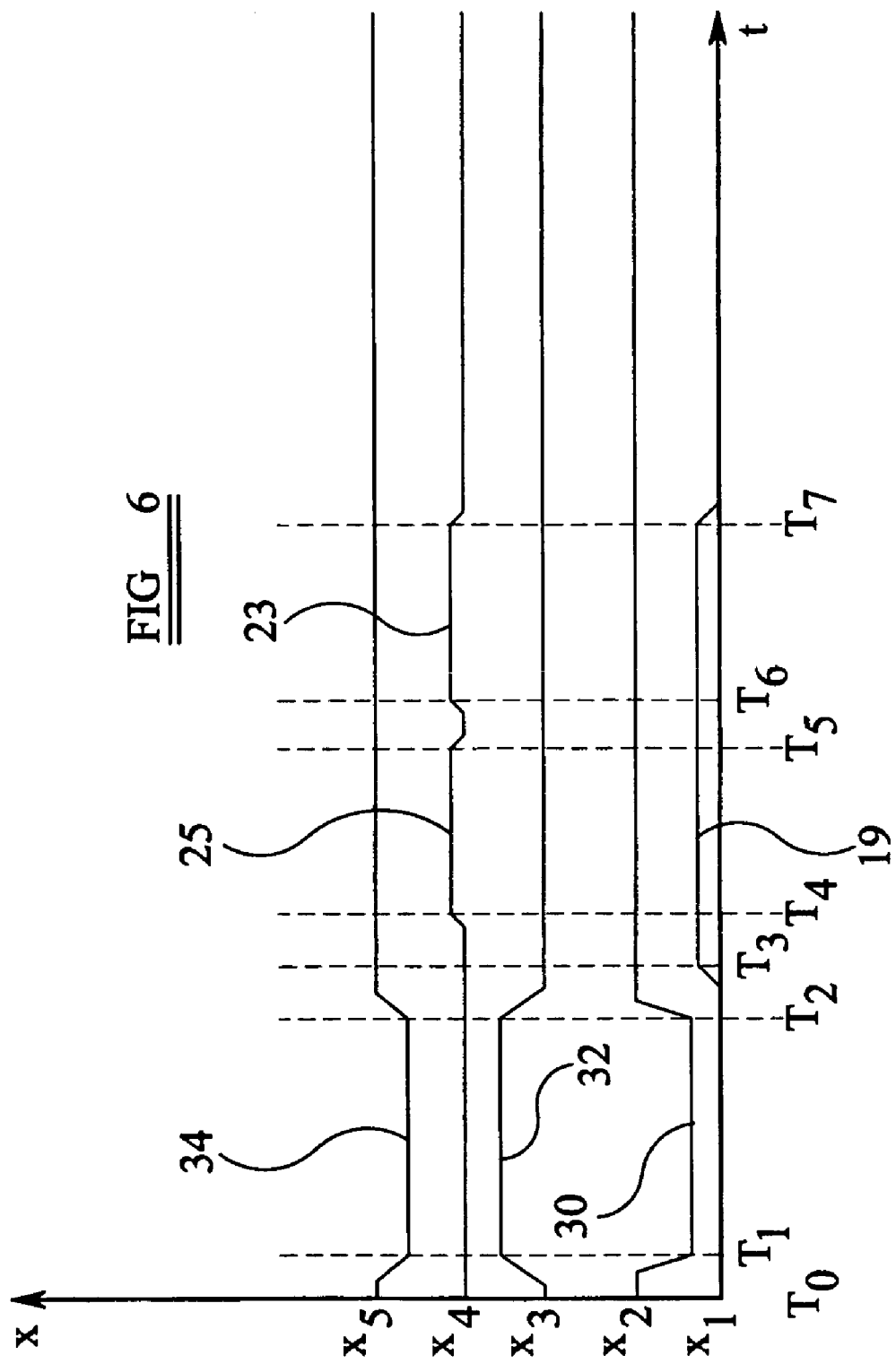

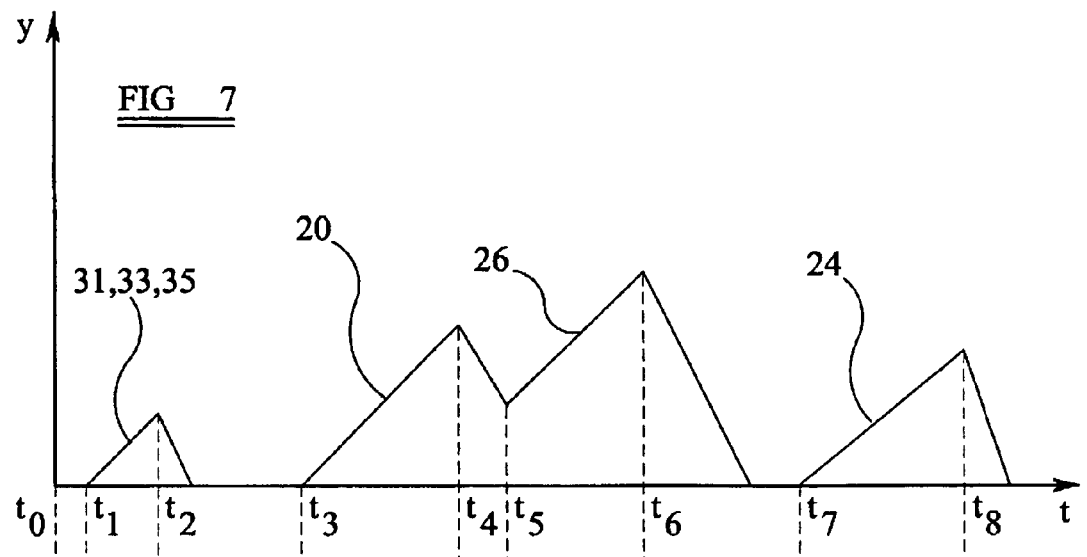
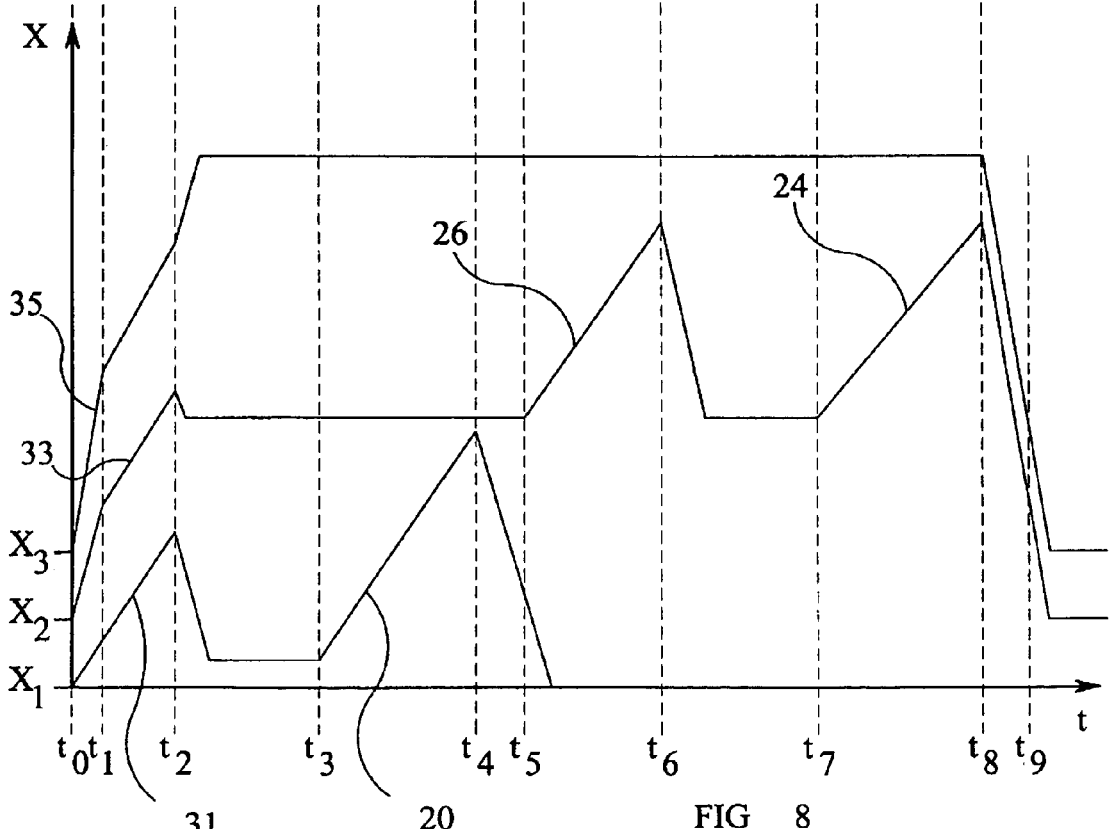

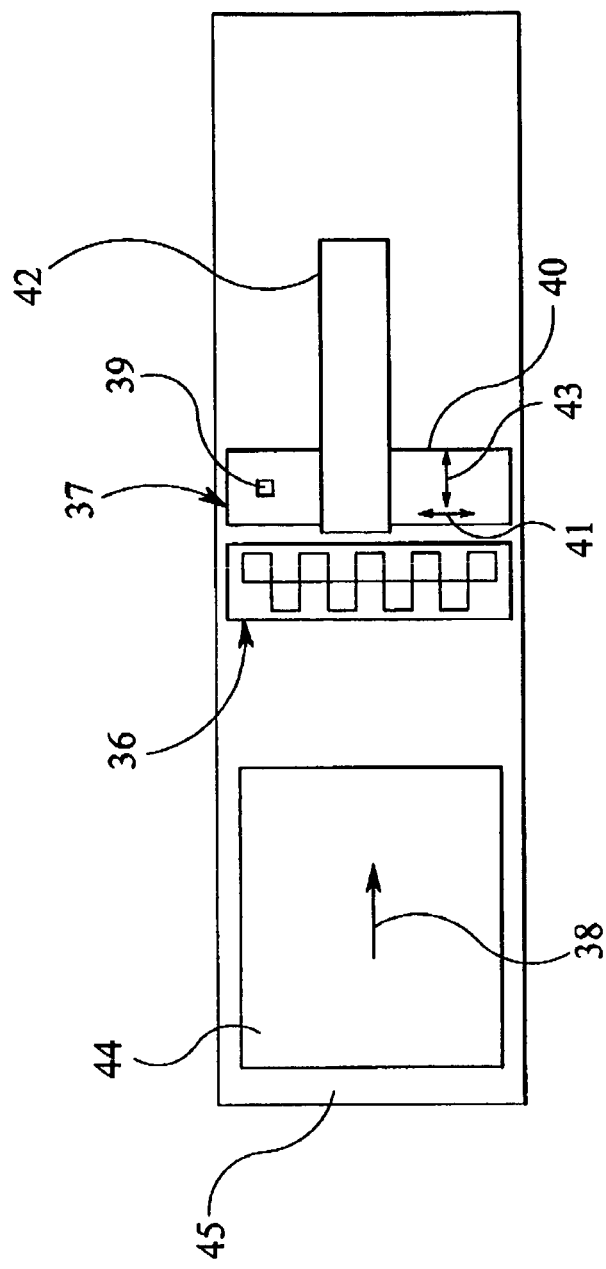
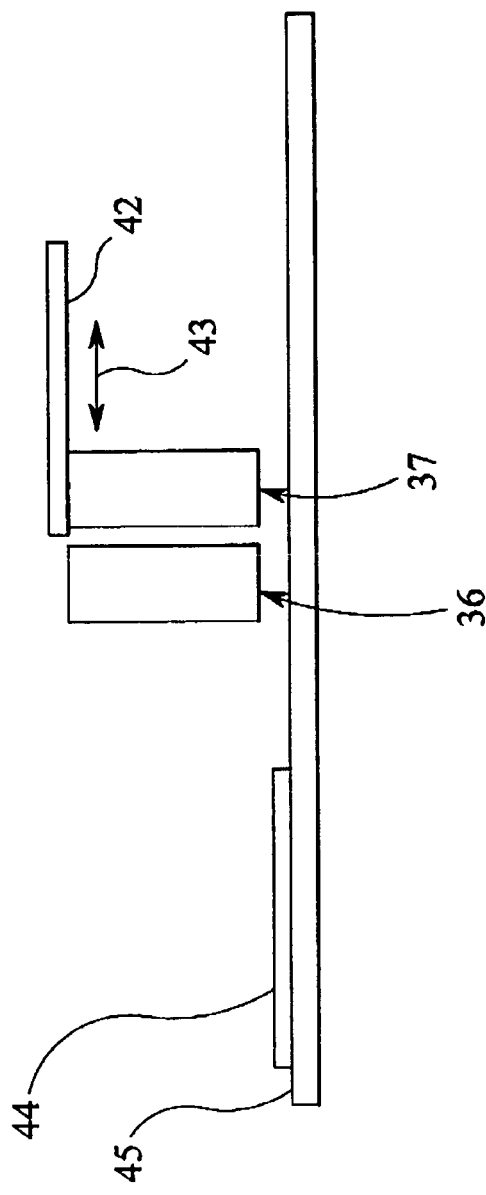

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, may be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., resist). Instead of a mask, the patterning means may comprise an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the beam in a given direction (the "scanning" direction), while synchronously scanning the substrate parallel or anti-parallel to this direction.

There is a desire to be able to efficiently manufacture devices having relatively large and relatively low resolution areas of one type and associated relatively small and relatively high resolution areas of a different type. For example, in flat panel display (FPD) screens a first relatively large area comprises a large number of pixels intended to define an image to be displayed occupies all but the periphery of a rectangular area. The resolution within the pixel area is relatively low. However, electronic circuits are also provided to drive the individual pixels. These electronic circuits are arranged around the periphery of the pixel area. Generally, an elongate array of electronic circuits is provided along one horizontal side and one vertical side of the pixel area, although electronic circuits may be provided along all four sides of the pixel area.

The traditional approach to the manufacture of FPD screens has been to (1) produce the pixel areas using lithographic methods; (2) glue separately manufactured integrated circuits to the reverse side of the screen, and (3) connect the integrated circuits to the individual pixels of the pixel area. Design rules (e.g., critical dimensions etc) for integrated circuits are increasingly more stringent, and much more stringent that design rules for the pixel area of FPD screens. The pixel areas of FPD screen are continuously being improved, which, in combination with the rapid rate of design change for integrated circuits, means that the combination of components making up an FPD screen changes in design even more rapidly than either integrated circuits of the pixel areas of the screens. This presents real challenges to the manufacturers of FPD screens.

SUMMARY OF THE INVENTION

According to an embodiment of the present invention, there is provided a lithographic apparatus comprising an illumination system for supplying beams of radiation, a patterning system serving to impart to the beams patterns in their cross-sections, a substrate table for supporting a substrate, a projection system for projecting the patterned beams onto target portions of the substrate, and a displacement system for causing relative displacement in a predetermined direction between a substrate on the substrate table and the patterned beams. The projection system comprises a first projection device for projecting a first, relatively large area patterned beam extending across a substantial proportion of a substrate supported on the substrate table and a second projection device for projecting at least one second, relatively small area patterned beam onto the substrate. The second patterned beam being selectively positionable relative to the first projection system at least in a direction transverse to the predetermined direction.

Another embodiment of the present invention provides a device manufacturing method comprising the steps of providing a substrate, providing beams of radiation using an illumination system, imparting to the beams patterns in their cross-sections, projecting the patterned beams of radiation onto target portions of the substrate, and causing relative displacement in a predetermined direction between a substrate on the substrate table and the patterned beams. A first, relatively large area beam is projected so as to extend across a substantial proportion of a substrate supported on the substrate table. At least one second, relatively small area patterned beam is projected onto the substrate. The second patterned beam is selectively positioned relative to the first projection device at least in a direction transverse to the predetermined direction.

Thus, according to the embodiments above, a single tool is capable of exposing a substrate in a manner appropriate to relatively large, low resolution areas and associated relatively small, high resolution areas.

In one example, a third projection device may be provided for projecting at least one third, relatively small area patterned beam onto the substrate. The third beam is selectively displaceable relative to the first projection device in both the predetermined direction and the transverse direction during relative displacement between the substrate and the first projection device.

In one example, the substrate table and first projection device may be fixed in position and the displacement system may be arranged to cause the displacement of the substrate across the substrate table and beneath each of the three projection devices.

In one example, the first patterned beam may be generated by an array of first optical columns distributed in the direction transverse to the direction of relative movement between the optical columns and the substrate. This allows for the exposure of the full width of the substrate in a single pass. For example, in the case of flat panel display screens, the first optical columns will provide the necessary exposure for relatively large pixel areas of the final product.

In one example, the second projection device may comprise an array of second optical columns distributed in the direction transverse to the direction of relative movement between the substrate and the beams. The second optical columns generate respective second patterned beams and are displaceable on a bridge extending over the substrate table. The second optical columns may be held stationary on the bridge so as to expose elongate portions of the substrate extending in the direction parallel to the direction of relative displacement between the substrate and the second optical columns.

In one example, the third projection device may comprise an array of third optical columns distributed in the transverse direction. The third optical columns generate respective third patterned beams. The third optical columns may be supported on a carriage extending over the substrate. The carriage is displaceable in the direction of relative displacement between the substrate and the first projection device and the third optical columns are displaceable on the carriage in the transverse direction.

In one example, the patterned beams may be generated by any appropriate device. For example, each patterned beam is generated by an array of individually controllable elements in a "maskless" manner.

It is to be appreciated that the patterned beams could also be produced using masks rather than arrays of individually controllable elements.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to allow a person skilled in the pertinent art to make and use the invention.

FIG. 2 is a schematic view from above of a lithographic apparatus, according to one embodiment of the invention.

FIG. 3 is a schematic view from one side of the apparatus of FIG. 2, according to one embodiment of the invention FIG. 4 is a schematic plan view of a flat panel display screen of a type that can be manufactured using the apparatus of FIGS. 2 and 3, according to one embodiment of the invention.

FIG. 5 is a schematic plan view of a flat panel display substrate on which have been formed six flat panel screens of a general format represented in FIG. 4, according to one embodiment of the invention.

Figure 1:
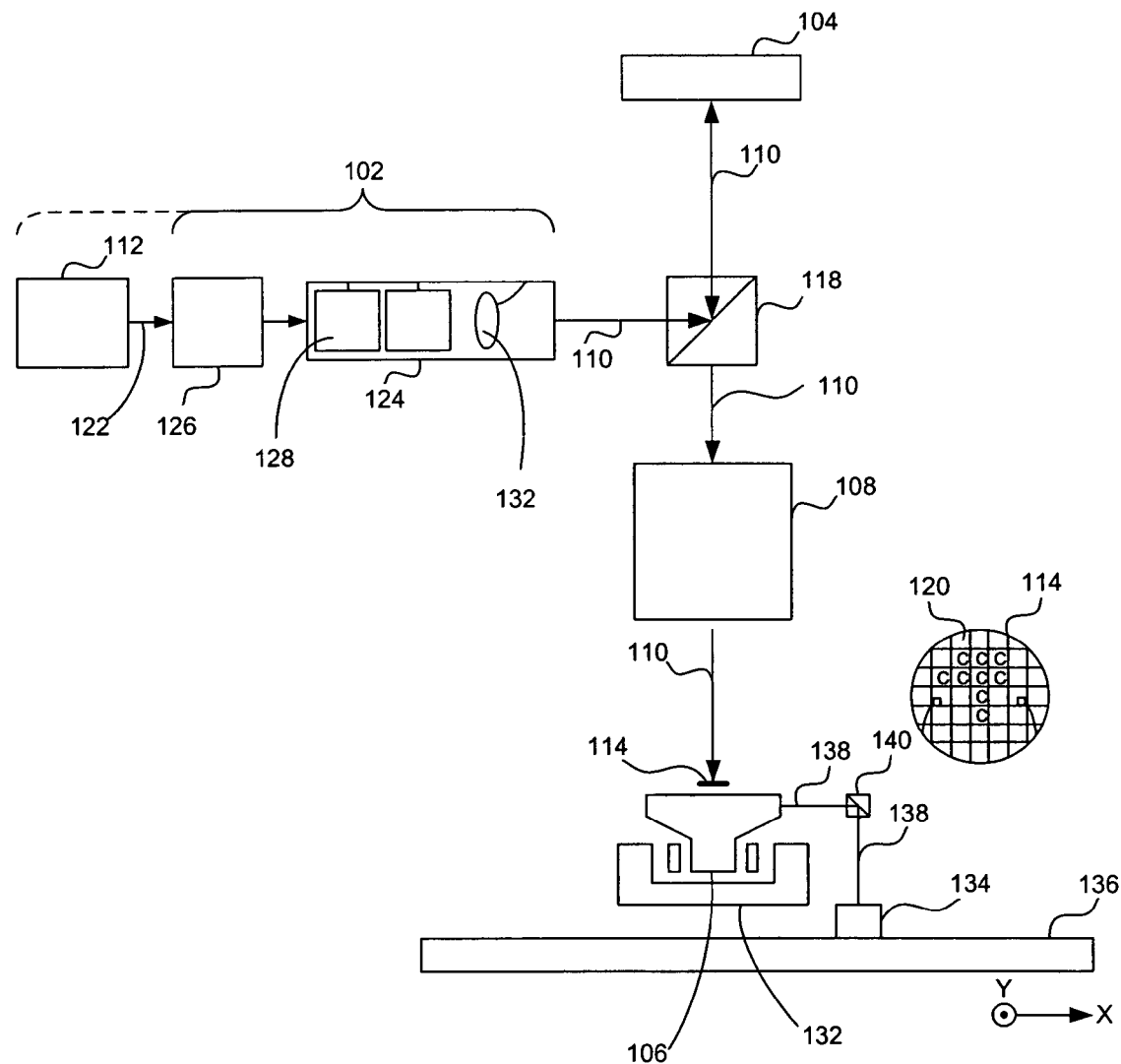
FIG. 1 depicts a lithographic apparatus, according to one embodiment of the invention.

FIGS. 6, 7 and 8 graphically represent a displacement of optical columns incorporated in the apparatus of FIGS. 2 and 3 to produce the six screens represented in FIG. 5, according to one embodiment of the invention.

FIG. 9 is a view from above a lithographic apparatus, according to one embodiment of the invention.

FIG. 10 is a view from one side of the apparatus of FIG. 9, according to one embodiment of the invention.

The present invention will now be described with reference to the accompanying drawings. In the drawings, like reference numbers may indicate identical or functionally similar elements.

DETAILED DESCRIPTION OF THE EMBODIMENTS

Overview and Terminology

Although specific reference may be made in this text to the use of lithographic apparatus in the manufacture of integrated circuits (ICs), it should be understood that the lithographic apparatus described herein may have other applications, such as the manufacture of integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (e.g., a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array may comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the beam of radiation, and such components may also be referred to below, collectively or singularly, as a "lens."

The lithographic apparatus maybe of a type having two (e.g., dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index (e.g., water), so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Further, the apparatus may be provided with a fluid processing cell to allow interactions between a fluid and irradiated parts of the substrate (e.g., to selectively attach chemicals to the substrate or to selectively modify the surface structure of the substrate).

Lithographic Projection Apparatus

FIG. 1 schematically depicts a lithographic projection apparatus 100 according to an embodiment of the invention. Apparatus 100 includes at least a radiation system 102, an array of individually controllable elements 104, an object table 106 (e.g., a substrate table), and a projection system ("lens") 108.

Radiation system 102 can be used for supplying a beam 110 of radiation (e.g., UV radiation), which in this particular case also comprises a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 may be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for accurately positioning substrate 114 with respect to projection system 108.

Projection system 108 (e.g., a quartz and/or CaF2 lens system or a catadioptric system comprising lens elements made from such materials, or a mirror system) can be used for projecting the patterned beam received from a beam splitter 118 onto a target portion 120 (e.g., one or more dies) of substrate 114. Projection system 108 may project an image of the array of individually controllable elements 104 onto substrate 114. Alternatively, projection system 108 may project images of secondary sources for which the elements of the array of individually controllable elements 104 act as shutters. Projection system 108 may also comprise a micro lens array (MLA) to form the secondary sources and to project microspots onto substrate 114.

Source 112 (e.g., an excimer laser) can produce a beam of radiation 122. Beam 122 is fed into an illumination system (illuminator) 124, either directly or after having traversed conditioning device 126, such as a beam expander 126, for example. Illuminator 124 may comprise an adjusting device 128 for setting the outer and/or inner radial extent (commonly referred to as σ-outer and σ-inner, respectively) of the intensity distribution in beam 122. In addition, illuminator 124 will generally include various other components, such as an integrator 130 and a condenser 132. In this way, beam 110 impinging on the array of individually controllable elements 104 has a desired uniformity and intensity distribution in its cross section.

It should be noted, with regard to FIG. 1, that source 112 may be within the housing of lithographic projection apparatus 100 (as is often the case when source 112 is a mercury lamp, for example). In alternative embodiments, source 112 may also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

Beam 110 subsequently intercepts the array of individually controllable elements 104 after being directing using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on abase plate 136 that receives interferometric beams 138 via beam splitter 140), substrate table 106 can be moved accurately, so as to position different target portions 120 in the path of beam 110. Where used, the positioning device for the array of individually controllable elements 104 can be used to accurately correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system may also be used to position the array of individually controllable elements 104. It will be appreciated that beam 110 may alternatively/additionally be moveable, while object table 106 and/or the array of individually controllable elements 104 may have a fixed position to provide the required relative movement.

In an alternative configuration of the embodiment, substrate table 106 may be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of accurately positioning substrate 114 with respect to the path of beam 110. Alternatively, substrate 114 may be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 may be used to project a patterned beam 110 for use in resistless lithography.

The depicted apparatus 100 can be used in four preferred modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, the array of individually controllable elements 104 is movable in a given direction (the so-called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned beam 110 scans across substrate 114 and exposes it.

Combinations and/or variations on the above described modes of use or entirely different modes of use may also be employed.

In the embodiment shown in FIG. 1, array of individually controllable elements 104 is a programmable mirror array. Programmable mirror array 104, comprises a matrix arrangement of tiny mirrors, each of which can be individually tilted about an axis. The degree of tilt defines the state of each mirror. The mirrors are controllable, when the element is not defective, by appropriate control signals from the controller. Each non-defective element is controllable to adopt any one of a series of states, so as to adjust the intensity of its corresponding pixel in the projected radiation pattern.

In one example, the series of states includes: (a) a black state in which radiation reflected by the mirror makes a minimum, or even a zero contribution to the intensity distribution of its corresponding pixel; (b) a whitest state in which the reflected radiation makes a maximum contribution; and (c) a plurality of states in between in which the reflected radiation makes intermediate contributions. The states are divided into a normal set, used for normal beam patterning/printing, and a compensation set, used for compensating for the effects of defective elements. The normal set comprises the black state and a first group of the intermediate states. This first group will be described as grey states, and they are selectable to provide progressively increasing contributions to corresponding pixel intensity from the minimum black value up to a certain normal maximum. The compensation set comprises the remaining, second group of intermediate states together with the whitest state. This second group of intermediate states will be described as white states, and they are selectable to provide contributions greater than the normal maximum, progressively increasing up to the true maximum corresponding to the whitest state. Although the second group of intermediate states are being described as white states, it will be appreciated that this is simply to facilitate the distinction between the normal and compensatory exposure steps. The entire plurality of states could alternatively be described as a sequence of grey states, between black and white, selectable to allow grey-scale printing.

Exemplary Lithography Systems with Multiple Projection Systems

FIG. 1 illustrates in general terms the component parts of a lithographic apparatus which can be used to expose a substrate to a single patterned beam. However, in one example, the present invention exposes a substrate to patterned beams delivered to the substrate by first, second, and third projection systems. Each of the first, second and third projection systems incorporate multiple patterned beam generating apparatus. Each such patterned beam generating apparatus is referred to below as an "optical column" and each of those columns may incorporate many of the components illustrated in FIG. 1. For example, each column can include an illumination system, an array of individually controllable elements (or alternatively a mask), and a lens system for imaging the patterned beam onto a substrate.

FIG. 2 is a schematic view from above of a lithographic apparatus, according to one embodiment of the invention. FIG. 3 is a schematic view from one side of the apparatus of FIG. 2, according to one embodiment of the invention Referring to FIGS. 2 and 3, a substrate table 1 holds a substrate 2 that is displaceable in a direction of arrow 3 (e.g., a scan or y direction). In this example, table 1 is a single structure, but table 1 could be made up from a series of stages arranged adjacent each other in the direction of substrate transport. In one example, substrate 2 could be supported on a transport device (not shown) that is driven across table 1. In one example, substrate 2 is supported on an air bearing generated by jets of air pumped through apertures (not shown) in table 1. First, second, and third projection devices 4, 5, and 6 are arranged above table 1 so that substrate 2 will pass successively beneath the three projection devices 4, 5, and 6.

In this embodiment, first projection device 4 comprises nine optical columns 7 that are fixed in position relative to table 1. It is to be appreciated that there may be more or less than optical columns as appropriate to a particular application. Each optical column 7 is represented by a simple square in FIG. 2, but it will be appreciated that each comprises all the components necessary to project a patterned beam onto substrate 2 on table 1.

The patterned beams projected by optical columns 7 together define what may be considered as a single elongate first patterned beam extending transversely across the full width of the path traversed by substrate 2. Thus, the full width of substrate 2 may be exposed in a single pass of substrate 2 beneath projection device 4, with each of the optical columns 7 contributing a respective part of the first patterned beam.

In this embodiment, second projection device 5 comprises five optical columns 8, each of which is again capable of generating a patterned beam. Columns 8 are spaced apart on a bridge extending over table 1 in the direction transverse to the transport direction (e.g., in an x direction as represented in FIG. 2). Columns 8 are selectively displaceable in that transverse x direction as represented by arrow 9. Thus, each column 8 generates a respective second patterned beam that can be used to expose an elongate substrate portion extending in the y direction of arrow 3 with the position in the x direction of the elongate portion being selectively controllable.

In this embodiment, third projection device 6 comprises three optical columns 10 mounted on a carriage 11, which is displaceable on a support 12 in a y direction represented by arrow 13. Columns 10 are displaceable relative to carriage 11 in the x direction transverse to the substrate transport direction. If the carriage 11 is transported in the y direction in synchronism with displacement of the substrate 2 when the substrate is beneath third projection device 6, and the columns 10 are simultaneously transported in the transverse x direction represented by arrow 14, each column 10 can be used to generate a respective third patterned beam that can expose an elongate substrate portion extending parallel to the transverse x direction and perpendicular to the y direction.

It will be appreciated that more or less optical columns may be incorporated in projection device 5 and/or projection device 6.

FIG. 4 is a schematic plan view of a flat panel display screen of a type that can be manufactured using the apparatus of FIGS. 2 and 3, according to one embodiment of the invention. In this embodiment, FIG. 4 schematically represents a layout of a flat panel display. Area 15 represents the area of a panel on which an image is to be displayed Area 15 is occupied by a regular array of pixel elements (not shown), each of which defines a single pixel of the displayed image. The pixel elements are connected to drive electronics, which are used to control each element. The drive electronics cannot be accommodated on the image display or pixel area 15, and therefore are located on relatively thin elongate portions of the panel extending along two of the edges of the panel.

In this embodiment, drive electronics 16 deliver control voltages to each row (e.g., line) of the pixel elements and drive electronics 17 deliver control voltage to each column of the pixel elements. In combination, these column and line control voltages control a state of each pixel element. It is to be appreciated that, although in the described FPD drive electronics 16 and 17 are provided along only two sides of the pixel area 15, in some designs drive electronics are provided along all four sides of the pixel area, and which is contemplated within the scope of the present invention.

FIG. 5 is a schematic plan view of a flat panel display substrate on which have been formed six flat panel screens of a general format represented in FIG. 4, according to one embodiment of the invention. For example, the substrates are approximately two meters square, for example about 1.8 m×about 2.2 m. In the illustrated example, the substrate has three different panel sizes or formats formed upon it. First, a relatively large panel having pixel element area 18 and drive electronics 19 and 20. Second, two intermediate size panels having pixel element areas 21 and 22 and drive electronics 23, 24, 25 and 26. Third, three small panels having pixel element areas 27, 28 and 29 and drive electronics 30, 31, 32, 33, 34 and 35.

In one example, each of the six pixel element areas and each of the twelve control element areas as shown in FIG. 5 may be exposed using the apparatus of FIGS. 2 and 3 as described below with reference to FIGS. 6, 7 and 8.

In this embodiment, the six pixel areas 18, 21, 22, 27, 28 and 29 are exposed during a single pass of substrate 2 beneath first projection device 4. Optical engines 7 are stationary with respect to table 1, and are controlled to adjust the projected patterns as substrate 2 is advanced across table 1.

The six control electronics areas 19, 23, 25, 30, 32, and 34 that extend parallel to the substrate transport direction are exposed during a single pass of the substrate 2 beneath the second projection device 5. This can be the same pass as is used to expose the pixel element areas. The optical columns 8 are positioned so that each of them is aligned with a respective one of five tracks on which there is an area to be exposed. Note that areas 19, 30, 32 and 34 are not aligned with any other area, but areas 23 and 25 are aligned and identical and therefore area 23 can be exposed by a single "repeat" of the pattern used to expose area 25.

The six control electronics areas 20, 31, 33, 35, 26 and 24 that extend perpendicular to the substrate transport direction are exposed during a single pass of substrate 2 beneath third projection device 6. This can be the same pass as is used to expose the pixel element areas and control electronics areas 19, 23, 25, 30, 32 and 34. Initially, the three optical columns 10 are each used to expose a respective one of areas 31, 33 and 35, one of the three optical columns 10 is then used to expose area 20, and another one of the three optical columns 10 is then used to expose areas 26 and 24. During an exposure of any one of areas 20, 31, 33, 35, 26 and 24, carriage 11 is displaced in synchronism with substrate 2, and between exposures carriage 11 is displaced in the opposite direction back towards an initial or starting position. The timing of such displacements is a function of the position and length of the areas to be exposed.

FIGS. 6, 7 and 8 graphically represent a displacement of optical columns incorporated in the apparatus of FIGS. 2 and 3 to produce the six screens represented in FIG. 5, according to embodiments of the invention.

FIG. 6 illustrates a sequence of events used to expose the areas 19, 23, 25, 30, 32 and 34, according to one embodiment of the present invention. Portions of the waveforms shown in FIG. 6 that correspond to exposure of each of these areas are labeled by the respective numerals allocated to those areas. Initially (time $t=T_0$), the five optical columns 8 are positioned at starting positions $x_1$, $x_2$, $x_3$, $x_4$ and $x_5$ respectively. The second, third and fifth optical columns 8 (counting in the x direction) are then displaced to be aligned at time $T_1$ with the desired x coordinate positions of lines 30, 32 and 34, respectively. These three optical engines 8 are then used to generate time-varying patterns to appropriately expose areas 30, 32 and 34 until at time $t=T_2$ substrate 2 is positioned, such that the full lengths of areas 30, 32 and 34 have been exposed. The projection of exposing beams is then terminated, and optical columns 8 are returned to their starting positions $x_2$, $x_3$ and $x_5$.

At time $t=T_3$, the leading end of area 19 reaches second projection device 5, and first (in the x direction) optical column 8 is aligned with area 19 and is used to project an appropriate patterned beam.

At time $t=T_4$, the leading end of area 25 reaches second projection device 5, and fourth (counting in the x direction) optical column 8 is aligned with area 25 and is then used to project an appropriate patterned beam. This beam projection is terminated at time $t=T_5$ (alignment of the trailing end of area 25 with optical columns 8), and the same beam pattern is then repeated in period $t=T_6$ to $T_7$. Beam exposing area 19 is also terminated at time $t=T_7$. Thus, all six areas which extend in the y direction are appropriately exposed in a single pass of a substrate beneath second projection device 5.

FIG. 7 represents the displacements of the carriage 11 relative to the support 12 of FIGS. 2 and 3 during exposure of areas 31, 33, 35, 20, 26 and 24, according to one embodiment of the present invention. Those sections of the waveform corresponding to exposure of these areas are indicated by the respective numerals allocated to these areas. At time $t=t_1$, areas 31, 33 and 35 are aligned with optical columns 10. Carriage 11 then moves in synchronism in the y direction with substrate 2 until time=$t_2$, at which time areas 31, 33 and 35 have been exposed as a result of displacement of optical columns 10 in the x direction, as described below. Carriage 11 is then returned to its starting position.

At time $t=t_3$, area 20 is aligned with optical columns 10. Carriage 11 is then moved in synchronism with substrate 2 again.

At time $t=t_4$, the full length of area 20 has been exposed, and carriage 11 begins the return to its starting position.

A time $t=t_5$, before carriage 11 has had time to return to its starting position, area 26 is aligned with optical columns 10. Optical columns 10 are then displaced again in the y direction on carriage 11 in synchronism with the displacement of substrate 2 until time $t=t_6$, at which time the full length of area 26 has been exposed. Carriage 11 is then returned to its starting position.

At time $t=t_7$, area 24 is aligned with optical columns 10, and once again carriage 11 is displaced in the y direction in synchronism with substrate 2 until the full length of area 24 has been exposed at time $t=t_8$. Carriage 11 then returns to its starting position, and therefore shortly after time $t=t_8$ processing of a further identical substrate could be initiated.

FIG. 8 represents the displacements of the three optical columns 10 relative to the carriage 11 necessary to expose areas 31, 33, 35, 20, 26 and 24, according to one embodiment of the present invention. Those sections of the waveforms of FIG. 8 corresponding to exposure of these areas are indicated by the respective numerals allocated to the areas.

At time $t=t_0$, when the leading edge of substrate 2 is aligned with columns 10, the three optical columns are at start positions $X_1$, $X_2$ and $X_3$. The three columns 10 are then displaced as shown so that at time $t=t_1$ each is aligned with the position in the x direction of a respective one of areas 31, 33 and 35. The three optical columns 10 are then displaced on carriage 11 until time $t=t_2$, at which time the full length of each area 31, 33 and 35 has been exposed.

In the interval immediately after time $t=t_2$, first optical column 10 (counting the x direction) is moved into alignment with the near (lower x coordinate) end of area 20, second optical column 10 is moved to a position beyond the far end of area 20 and aligned with the near end of areas 26 and 24, and third optical column 10 is moved to a position beyond the far ends of the areas 26 and 24.

At time $t=t_3$, first optical column 10 is displaced in the x direction to expose area 20, that displacement being terminated at time $t=t_4$, and first optical column 10 is then returned to its starting position ($x=X_1$).

At time $t=t_5$, second optical column 10 is displaced in the x direction to expose area 26, that displacement being terminated at time $t=t_6$. Second optical column 10 is then moved into alignment with the near end of area 24, and is then again displaced in the x direction in the period beginning at time $t=t_7$.

At time $t=t_8$, the return of the second and third optical columns 10 to their starting positions is initiated.

From time $t=t_9$ onwards, all three optical columns 10 are in positions, such that processing of a further identical substrate could be initiated.

It will be appreciated that each of optical columns 7, 8 and 10 could be of any appropriate type. In one example, optical columns 7, 8, and 10 could be maskless (e.g., relying upon an array of individually controllable elements to pattern the projected beams). In another example, optical columns 7, 8, and 10 could be or mask (e.g., reticle) based. In a further example, optical columns 7, 8, and 10 could be a combination of the two.

In one example, a maskless large area projection device (device 4 of FIGS. 2 and 3) produces exposure patterns with resolutions of an order of about 1 mm. This is done using a limited numerical aperture (NA<0.5) and no phase shifting to achieve only "white", "gray," or "black" elements. Also, small area maskless projection devices (devices 5 and 6 of FIGS. 2 and 3) provide exposure patterns with higher resolutions (e.g., about 35 micrometers) with higher numerical apertures (e.g., NA>0.5 or even NA>1.0 with immersion) and possibly using phase shifting between adjacent pixels of the patterned beams to achieve white/gray/black and negative gray/white elements.

It will also be appreciated that, although there are nine optical columns in first projection device 4, five optical columns in second projection device 5, and three optical columns in third projection device 6, the number of optical columns provided in each projection device will be selected as is appropriate for a particular application.

It will also be appreciated that not all of the first, second and third projection devices will necessarily be used on each pass of a substrate through the apparatus. For example, depending upon the nature of the pixel element area and drive electronics area exposures required, on some passes of the substrate beneath the three projection devices 4, 5 and 6 only one or two of these projection devices may be used to expose the substrate. Overall however the total number of passes of the substrate through the apparatus necessary to produce a particular end product will be substantially reduced as compared with producing the same product in apparatus provided with only a single exposure device.

FIG. 9 is a view from above a lithographic apparatus, according to one embodiment of the invention. FIG. 10 is a view from one side of the apparatus of FIG. 9, according to one embodiment of the invention. FIGS. 9 and 10 show an alternative embodiment of the invention suitable for exposing a single FPD of the type illustrated in FIG. 4. Rather than having three projection devices, as in the embodiment of FIGS. 2 and 3, in the embodiment of FIGS. 9 and 10 only two projection devices are provided. A first projection device 36 delivers a substrate-wide relatively large area beam suitable for exposing a pixel area 15, as shown in FIG. 4. A second projection device 37 delivers a relatively small area single beam capable of being displaced in the direction of scan 38 and suitable for forming drive electronics areas 16 and 17, as shown in FIG. 4. Projection device 36 is identical to device 4 of FIGS. 2 and 3, whereas the projection device 37 differs from device 6 of FIGS. 2 and 3 in so far as only one optical column 39 is provided. Single optical column 39 is displaceable on a carriage 40 in a direction of arrow 41. Carriage 40 is displaceable on a support 42 in a direction of arrow 43. As in the case of the embodiment of FIGS. 2 and 3, a substrate 44 is displaceable on a substrate table 45 beneath the projection devices.

In this embodiment, in order to expose the FPD of FIG. 4, optical column 39 is initially aligned with the bottom end of electronics area 17 as represented in FIG. 4. The substrate is then advanced beneath the projection device 36, the device 36 exposing the pixel area 15. As soon as the electronics area 17 is aligned with the optical column 9 in the y direction, carriage 40 is displaced in the y direction in synchronism with substrate 2 and optical column 39 is displaced in the "negative x" direction on carriage 40. This allows the exposure of the full length of area 17. Once area 17 has been exposed, optical column 39 is maintained stationary as is carriage 40. Substrate 2 is then further advanced so that area 16 passes beneath optical column 39, allowing optical column 39 to provide an appropriate exposure to area 16. Carriage 40 is then returned to its original position so as to be ready for a subsequent manufacturing cycle.

Thus, according to this embodiment, the three areas 15, 16 and 17 of the FPD shown in FIG. 4 are exposed in a single pass of substrate 2 beneath only two optical columns.

It will be appreciated that an FPD of the type shown in FIG. 4, but provided in addition with drive electronics areas along all four sides of the pixel area, could be appropriately exposed using two optical columns 39 with each optical column 39 exposing one of the drive electronics areas extending in the x direction and one of the electronics areas extending in the y direction. It is also to be appreciated that multiple FPD's on a single glass panel could be exposed using appropriate numbers of optical columns 39. Although the invention has been described in the context of forming products intended to serve as flat panels displays, the invention may of course be applied to the manufacture of any product requiring relatively large area portions of one type and relatively low area portions of a different type.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. An apparatus, comprising:
an illumination system that supplies beams of radiation;
a patterning system that patterns the beams;
a projection system that projects the patterned beams onto target portions of a substrate, the projection system comprising,
a first projection device that projects a first one of the patterned beams onto a first area on the substrate, which extends across a substantial portion of the substrate, and
a second projection device that projects at least one second one of the patterned beams onto a second area on the substrate, the second area being smaller than the first area, and
a displacement system that causes relative displacement in a predetermined direction between the substrate and the patterned beams,
wherein the second projection device is selectively positionable relative to the first projection device at least in a direction transverse to the predetermined direction.

2. The apparatus of claim 1, wherein the projection system further comprises:
a third projection device that projects at least one third one of the patterned beams onto a third area on the substrate, the third area being smaller than the first area, wherein the third beam is selectively displaceable relative to the first projection device in both the predetermined direction and the transverse direction during relative displacement between the substrate and the first projection device.

3. The apparatus of claim 1, further comprising:
a plurality of first optical columns distributed in the transverse direction, each of the plurality of first optical columns generating a respective patterned beam that forms part of the first beam.

4. The apparatus of claim 1, wherein the projection system further comprises:
a plurality of second optical columns distributed in the transverse direction, wherein each of the plurality of the second optical columns,
generate respective ones of the at least one second patterned beams,
is supported on a bridge extending over a substrate table, and
is displaceable on the bridge in the transverse direction.

5. The apparatus of claim 1, wherein the projection system further comprises:
a plurality of third optical columns distributed in the transverse direction, wherein each of the third optical columns,
generates a respective third one of the patterned beams on a third area on the substrate, the third area being smaller than the first area, is supported on a carriage extending over a substrate table, is displaceable on the carriage in the transverse direction, and wherein the carriage is displaceable in the predetermined direction.

6. The apparatus of claim 1, further comprising:

a substrate table that supports the substrate, wherein the substrate table and first projection device are fixed in position and the displacement system causes displacement of the substrate across the substrate table.

7. The apparatus of claim 1, wherein the patterning system comprises:

one or more an arrays of individually controllable elements, wherein each of the patterned beams is generated by a respective one of the one or more arrays of individually controllable elements.

8. A system, comprising:

an illumination system configured to supply beams of radiation;

a patterning system configured to pattern the beams;

a projection system configured to project the patterned beams onto respective target portions of a substrate, the projection system comprising, a first projection device configured to project a first one of the patterned beams to a first one of the respective target portions of the substrate, and a second projection device configured to project a second one of the patterned beams to a second one of the respective target portions of the substrate, wherein the second one of the respective target portions is smaller than the first one of the respective target portions; and a displacement system configured to cause relative displacement between the substrate and the patterned beams in a first direction, wherein the second projection device is positionable relative to the first projection device at least in a second direction transverse to the first direction.

9. The system of claim 8, wherein the projection system further comprises:

a third projection device configured to project a third one of the patterned beams onto a third one of the respective target portions of the substrate, wherein the third one of the respective target portions is smaller than the first one of the respective target portions, and the third beam is displaceable relative to the first projection device in both the first direction and the second direction.

10. The system of claim 8, further comprising:

a plurality of optical columns distributed in the second direction, each of the plurality of optical columns configured to generate a respective portion of the first one of the patterned beams.

11. The system of claim 10, wherein the projection system further comprises:

a bridge extending over the substrate; and a plurality of second optical columns supported by the bridge and distributed in the second direction, wherein each of the plurality of the second optical columns is configured to generate a respective portion of the second one of the patterned beams, and to be displaceable on the bridge in the second direction.

12. The system of claim 11, wherein the projection system further comprises:

a carriage extending over the substrate and configured to be displaceable in the first direction; and a plurality of third optical columns supported by the carriage and distributed in the second direction, wherein each of the plurality of third optical columns is configured to generate a respective portion of a third one of the patterned beams and to be displaceable on the carriage in the second direction.

13. The system of claim 8, further comprising:

a substrate table configured to support the substrate, such that the substrate table and the first projection device are relatively fixed; and wherein the displacement system causes displacement of the substrate across the substrate table.

14. The system of claim 8, wherein the patterning system comprises:

a plurality of arrays of individually controllable elements, wherein each respective array in the plurality of arrays of individually controllable elements patterns a corresponding one of the patterned beams.

* * * * *